US007923624B2

(12) United States Patent
Borton

(10) Patent No.: US 7,923,624 B2
(45) Date of Patent: Apr. 12, 2011

(54) SOLAR CONCENTRATOR SYSTEM

(75) Inventor: David Borton, Troy, NY (US)

(73) Assignee: Solar Age Technologies, Troy, NY (US)

( * ) Notice: Subject to any disclaimer, the term of this patent is extended or adjusted under 35 U.S.C. 154(b) by 166 days.

(21) Appl. No.: 12/142,481

(22) Filed: Jun. 19, 2008

(65) Prior Publication Data

US 2009/0314325 A1 Dec. 24, 2009

(51) Int. Cl.
*H01L 31/042* (2006.01)
*H01L 31/00* (2006.01)
*H02N 6/00* (2006.01)

(52) U.S. Cl. ......................... 136/246; 136/243; 136/244

(58) Field of Classification Search ........................ None
See application file for complete search history.

(56) References Cited

U.S. PATENT DOCUMENTS 2,987,961 A 6/1961 Cotton et al.
3,058,394 A 10/1962 Edlin
3,905,352 A 9/1975 Jahn
3,986,021 A 10/1976 Hitchcock
4,011,854 A 3/1977 Brantley et al.
4,043,644 A 8/1977 Humphrey
4,131,485 A 12/1978 Meinel et al.
4,162,825 A 7/1979 Dowty
4,195,620 A 4/1980 Rust
4,301,321 A 11/1981 Bartels
4,350,412 A 9/1982 Steenblik et al.
4,385,430 A 5/1983 Bartels
4,548,195 A 10/1985 Balhorn
4,682,865 A 7/1987 Rogers et al.
4,716,258 A 12/1987 Murtha
4,784,700 A 11/1988 Stern et al.
4,800,868 A 1/1989 Appeldorn et al.
4,993,233 A 2/1991 Borton et al.
5,154,777 A 10/1992 Blackmon et al.
5,325,844 A 7/1994 Rogers et al.
5,374,317 A 12/1994 Lamb et al.
5,660,644 A 8/1997 Clemens
5,899,199 A 5/1999 Mills
6,131,565 A 10/2000 Mills
6,201,179 B1 3/2001 Dalacu (Continued)

OTHER PUBLICATIONS

David Borton, Electricity from Sunshine is Magic, Oct. 15, 2001, www.rpi.edu/~bortond/PVTracker/DBtalk.html, pp. 1-3, website accessed Apr. 15, 2010.*

(Continued)

*Primary Examiner* — Alexa D Neckel
*Assistant Examiner* — Shannon Gardner
(74) *Attorney, Agent, or Firm* — Heslin Rothenberg Farley & Mesiti P.C.; Victor A. Cardona

(57) ABSTRACT

A solar energy concentrator system includes a supporting structure and a plurality of solar modules coupled to the supporting structure. Each module of the plurality of solar modules includes a plurality of Fresnel reflectors. The plurality of reflectors is arranged to focus solar radiation linearly onto a photovoltaic cell providing two axis concentration. The supporting structure is rotatably connected to a plurality of support members and aligned to allow the supporting structure to rotate about a polar axis. A plurality of optical trusses is connected to the plurality of solar modules and rotatably connected to the supporting structure to allow the plurality of solar modules to be rotated about a declination axis to track a motion of the sun through seasons of the year.

19 Claims, 5 Drawing Sheets

U.S. PATENT DOCUMENTS

| | | | | |
|---|---|---|---|---|
| 6,485,152 | B2 | 11/2002 | Wood | |
| 6,653,551 | B2 | 11/2003 | Chen | |
| 6,717,045 | B2 | 4/2004 | Chen | |
| 6,988,809 | B2 | 1/2006 | Rabinowitz | |
| 7,081,584 | B2 | 7/2006 | Mook | |
| 7,190,531 | B2 | 3/2007 | Dyson et al. | |
| 2002/0179138 | A1* | 12/2002 | Lawheed | 136/246 |
| 2004/0140000 | A1 | 7/2004 | Cohen et al. | |
| 2004/0246596 | A1 | 12/2004 | Dyson et al. | |
| 2006/0132932 | A1 | 6/2006 | Dyson et al. | |
| 2006/0169315 | A1 | 8/2006 | Levin | |

OTHER PUBLICATIONS

International Search Report (PCT/ISA/210) and Written Opinion (PCT/ISA/237) from corresponding International Application No. PCT/US2009/047975 dated Aug. 7, 2009 and mailed Aug. 17, 2009.

"Fresenel Lens Solar Concentrator," www.geocities.com/ralfsun/?20075, pp. 1-7, accessed Jul. 5, 2007.

"The Shining Eye of the Lighthouse", www.lanternroom.com/misc/freslens.htm, pp. 1-2, accessed Jul. 5, 2007.

"Tracking Photovoltaic System", www.rpi.edu/~bortonh/PVTracker/, pp. 1-3, accessed Jul. 6, 2007.

* cited by examiner

SOLAR CONCENTRATOR SYSTEM

TECHNICAL FIELD

This invention relates, in general, to generating electricity from solar energy and, in particular, to systems and methods for concentrating solar energy to generate electricity.

BACKGROUND ART

Conventional photovoltaic (PV) systems generate electricity by direct exposure to the sun, i.e., they are designed for substantially 1-sun operation. In contrast concentrator PV systems rely on optical devices (e.g., mirrors) to concentrate more than one sun worth of solar radiation on a solar collector.

Concentrator PV systems scale in size differently than conventional flat-plate photovoltaic systems, which are made for substantially 1-sun operation. Conventional PV is scaled by adding more panels (i.e., surface area) to generate different amounts of electricity. However, increasing the power output of a particular system requires additional PV cells, and large areas of semi-conductor PV cells are expensive. Concentrator PV uses optical devices to increase the solar energy landing on the expensive PV cells, reducing the cost of the PV system. Concentrator systems have attempted to track the sun's relative motion in the sky to allow for efficient optical concentration of solar energy during the course of a day. It is important to note that the angle of the sun relative to a particular geographic location also changes throughout the year, i.e., through the course of the seasons.

Further, the scaling of convex lens optical systems for concentrator systems to regulate the amount of power output is limited by the mass of material needed to form a larger concentrator. A paraboloid is a specific shape which can reflect parallel rays of light to a point. It can be scaled to any size but the shape always stays the same. A common parameter for scaling the paraboloid is the focal length, f. For a given focal length, the active area of a paraboloidal concentrator is increased by increasing the diameter, d, of the physical reflective part of the concentrator.

In principle, devices with the highest optical quality are simply the largest possible paraboloidal reflectors symmetric about the optical axis gathering light incident along that axis. A paraboloid, however, tends to use a large amount of materials, is difficult to construct accurately while maintaining shape under varying gravity and wind loads, and requires a substantial structure for tracking the sun in the sky.

Thus, a need exists for solar concentrator systems which are energy efficient, cost efficient and which track the sun's motion through the sky.

SUMMARY OF THE INVENTION

The present invention provides, in a first aspect, a solar energy concentrator system which includes a supporting structure and a plurality of solar modules coupled to the supporting structure. Each module of the plurality of solar modules includes a plurality of Fresnel reflectors. The plurality of reflectors is arranged to focus solar radiation linearly onto a photovoltaic cell or array of photovoltaic cells. The supporting structure is rotatably connected to a plurality of support members and aligned to allow the supporting structure to rotate about a polar axis. A plurality of optical trusses is connected to the plurality of solar modules and rotatably connected to the supporting structure to allow the plurality of solar modules to be rotated by the declination axis to track a motion of the of sun through seasons of the year.

The present invention provides, in a second aspect, a method for solar energy concentration which includes coupling a plurality of solar modules to a supporting structure. Each module of the solar modules includes a plurality of Fresnel reflectors. The plurality of reflectors is arranged to focus solar radiation linearly onto a photovoltaic cell or an array of photovoltaic cells. The supporting structure is rotatably connected to a plurality of support members and aligned to allow the supporting structure to rotate about a polar axis. A plurality of optical trusses is connected to the plurality of solar modules and rotatably connected to the supporting structure to allow the plurality of solar modules to be rotated about a declination axis to track a motion of the sun through seasons of the year.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention will be apparent from the following detailed description of preferred embodiments taken in conjunction with the accompanying drawings in which:

DETAILED DESCRIPTION

In accordance with the principles of the present invention, a solar concentrator system and methods for concentrating solar energy to generate electricity are provided.

Figure 1:
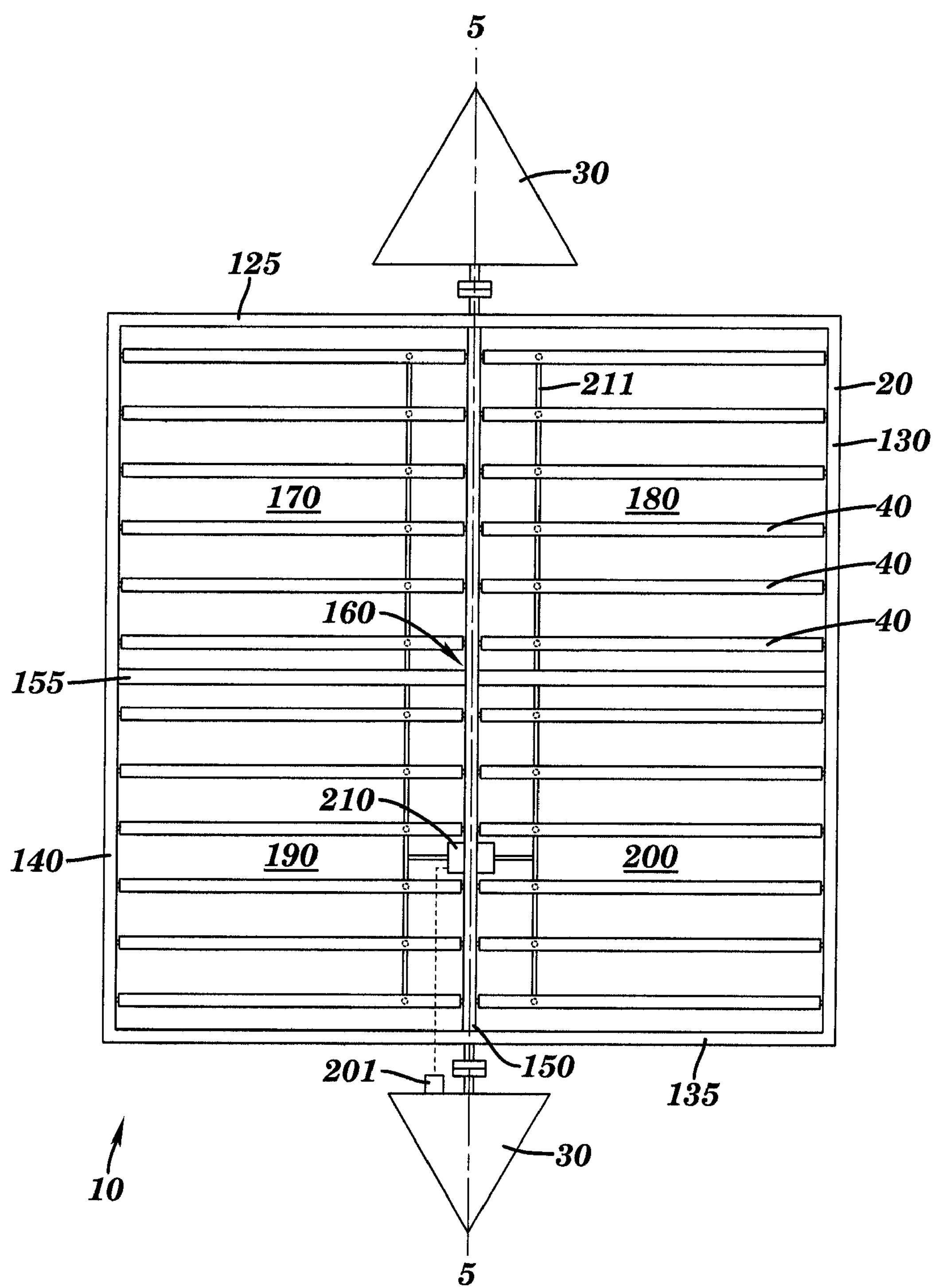
FIG. 1 is a top elevation view of a supporting structure of a solar concentrator system in accordance with the present invention.

In an exemplary embodiment depicted in FIG. 1, a solar panel system 10 includes a supporting structure or frame 20 mounted on support members or towers 30. Frame 20 is rotatably connected to a plurality of optical trusses 40 which support a plurality of solar concentrator reflector modules 50.

Figure 2:
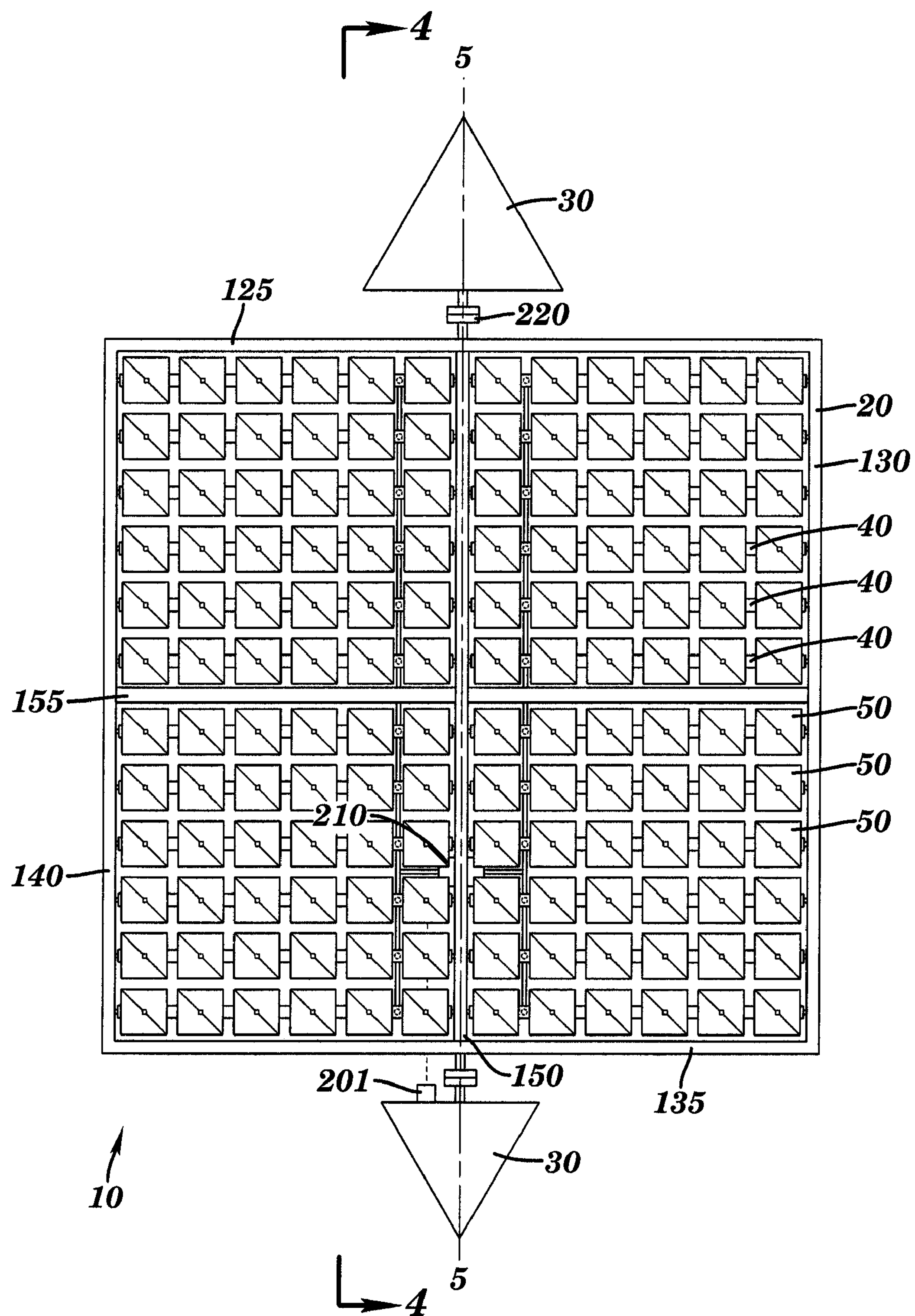
FIG. 2 is a top elevational view of a solar concentrator system including the supporting structure of FIG. 1 in accordance with the present invention.

As depicted in FIG. 1, frame 20 includes a North truss 125 opposite a South truss 135 and an East truss 130 opposite a West truss 140. A North-South connecting truss 150 connects North truss 125 to South truss 135. An East-West connecting truss 155 connects East truss 130 to West truss 140. East-West connecting truss 155 and North-south connecting truss 150 are connected to each other at a center area 160. System 10 is divided into four quadrants by the trusses depicted in FIG. 1: first quadrant 170, second quadrant 180, third-quarter 190, and fourth quadrant 200. Each quadrant may include plurality of optical trusses 40 supporting solar panel modules 50 as depicted in FIG. 2. For example, each quadrant may include 5-10 (e.g., 7-9) optical trusses connected to frame 20 with six such trusses being depicted in each quadrant in FIG. 1.

As indicated, optical trusses 40 may be connected to frame 20 in any number of ways such that the optical trusses 40 may be controlled by a controller 201 which drives a motor or actuator to cause the desired rotation. For example, each truss may include a pin having gears which may be received in a socket having opposing engaging gears, which is driven by a motor 210 mounted on frame 20. The motor may be controlled by controller 201 coupled to the motor thereby allowing the controller to control the rotation of the optical truss(es) relative to frame 20. In another example, motor 210 may be connected to a link 211 which is connected to each of optical trusses 40 such that the motor may drive the link to rotate each of optical trusses 40 simultaneously. Link 211 may be a connecting member which is rotatably connected to rotatable links 212 connected directly to optical links 40 such that linear movement of link 211 causes optical trusses 40 to rotate to provide the declination motion. In a further example, a hydraulic cylinder may be used to move a drag link. In yet a further example, each optical truss may have a wheel fixed at one end thereof. A cable or cord may wrap around the wheel and the cord or cable may be attached to the drag link. Linear motion of the drag link imparts equal rotation to each of the optical trusses to provide the declination. Further, multiple motors may be provided to rotate one or more of the applicable trusses as controlled by a controller, such as controller 201.

Figure 4:
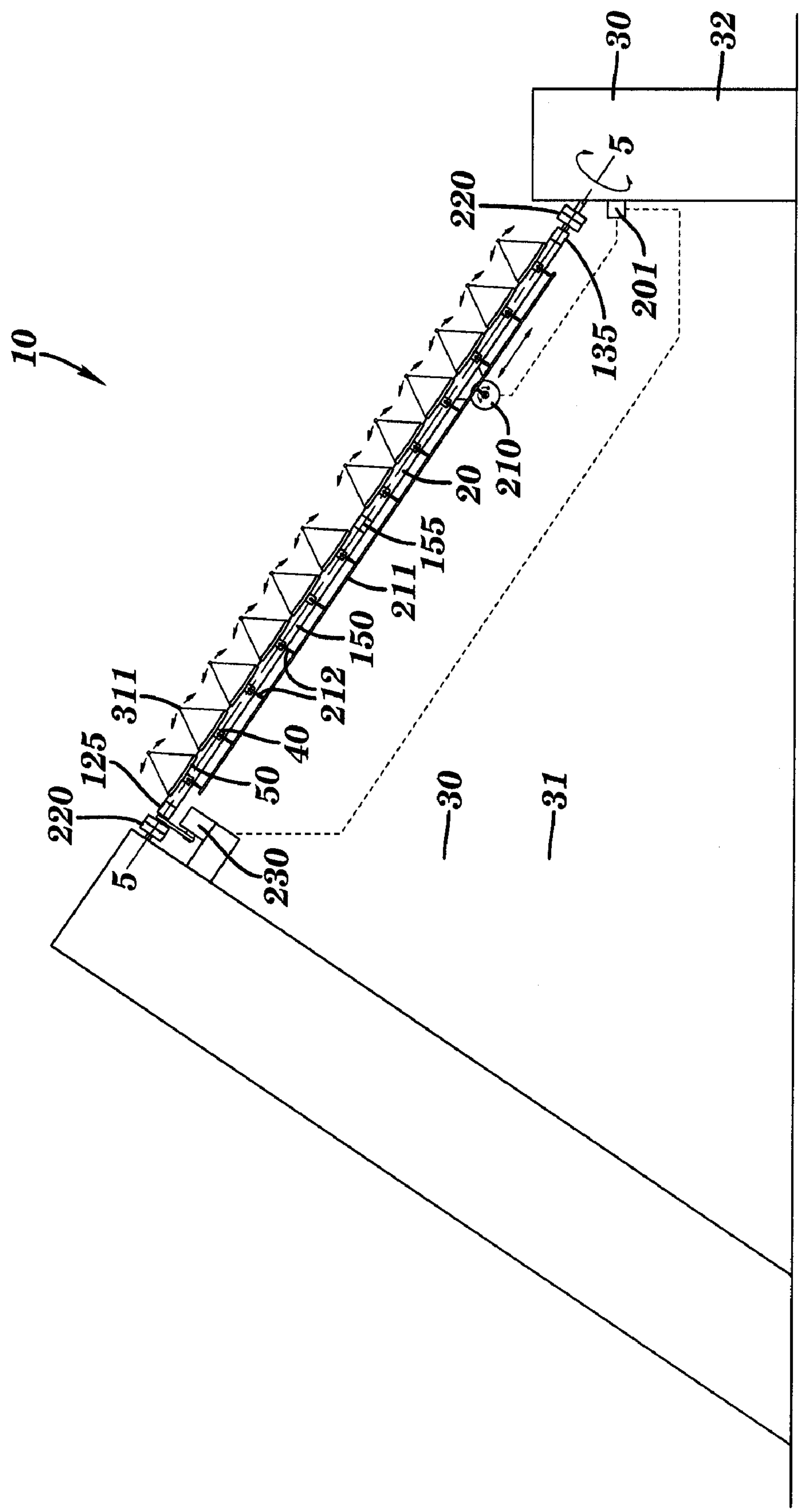
FIG. 4 is a side elevational view of the system of FIG. 2.

Frame 20 may be rotatably connected to towers 30 as depicted in FIG. 4. Towers 30 and/or frame 20 may include a motor(s) to cause the rotation of frame 20 relative to the towers. For example, frame 20 may rotate about rotating connectors 220 relative to towers 30 to allow frame 20 to be driven by a motor 230 controlled by controller 200. As described above relative to optical trusses and motor 210, motor 230 may be connected to frame 20 such that motor 230 controlled by controller 201 causes a rotation of frame 20 about connectors 220. For example, motor 230 may be coupled to frame 20 via a link, cord or cable. In another example, a hydraulic cylinder may drive a drag link to rotate frame 20.

Controller 201 may be mounted to one of towers 30, frame 20 or at any location such that the controller may be coupled to motor(s) (e.g., motor 210) driving the optical trusses (e.g., optical trusses 40) and/or motor(s) (e.g., motor 230) driving frame 20 relative to towers 30. Rotating connectors 220 may be bearing supports connected to frame 20 and towers 30 to facilitate the rotation between frame 20 and towers 30. The towers may have a fixed foundation attached to the ground. The towers provide strength to transfer forces, including gravitational, wind, seismic, and inertial, from system 10 to the ground.

The movement of frame 20 relative to towers 30 allows system 10 to track movement of the sun throughout the day by rotating about a first polar axis 5 (FIGS. 1 and 4) which is aligned parallel to the rotation axis of the earth. As depicted in FIG. 4, a North Tower 31 may be higher than a south Tower 32 to facilitate the facing of system 10 toward the sun in the Northern Hemisphere. The mounting of frame 20 between the towers and the rotation of frame 20 about the polar axis allows system 10 to track the motion of the sun through the day. The heights of the towers are configured for the Northern Hemisphere and would be opposite (i.e., the south tower would be higher than the north tower) if utilized in the Southern Hemisphere. System 10 as depicted in FIG. 4 is angled substantially for mid-day (i.e., horizontally with west truss 140 and East truss 130 substantially equidistant relative to the surface of the ground) and would rotate such that west truss 140 will be moved downwardly and East truss 130 would move upwardly through a remainder of the day (i.e. from mid-day forward) as frame 20 rotates about the polar axis. Thus, frame 20 rotates about the polar axis throughout the day driven by a motor to track the daily apparent movement of the sun.

As indicated above, optical trusses 40 are rotatably connected to frame 20 and may be driven by one or more motors, such as motor 210, controlled by a controller, such as controller 200. The optical trusses may be substantially parallel to each other and North truss 125 and South truss 135, along with being substantially perpendicular to polar axis 5. The rotation of the optical trusses about declination axes substantially perpendicular to the polar axis provides declination angle tracking of the sun, i.e. tracking of the sun through the seasons of the year. More specifically, in addition to the daily movement of frame 20 relative to the movement of the sun through the day (i.e., about the polar axis), the rotation of the optical trusses (e.g. daily prior to operation of system 10) allows optimal orientation of system 10 (e.g., modules 50 mounted on optical trusses 40) toward the sun on a seasonal basis to provide optimal efficiency of system 10.

Figure 3:
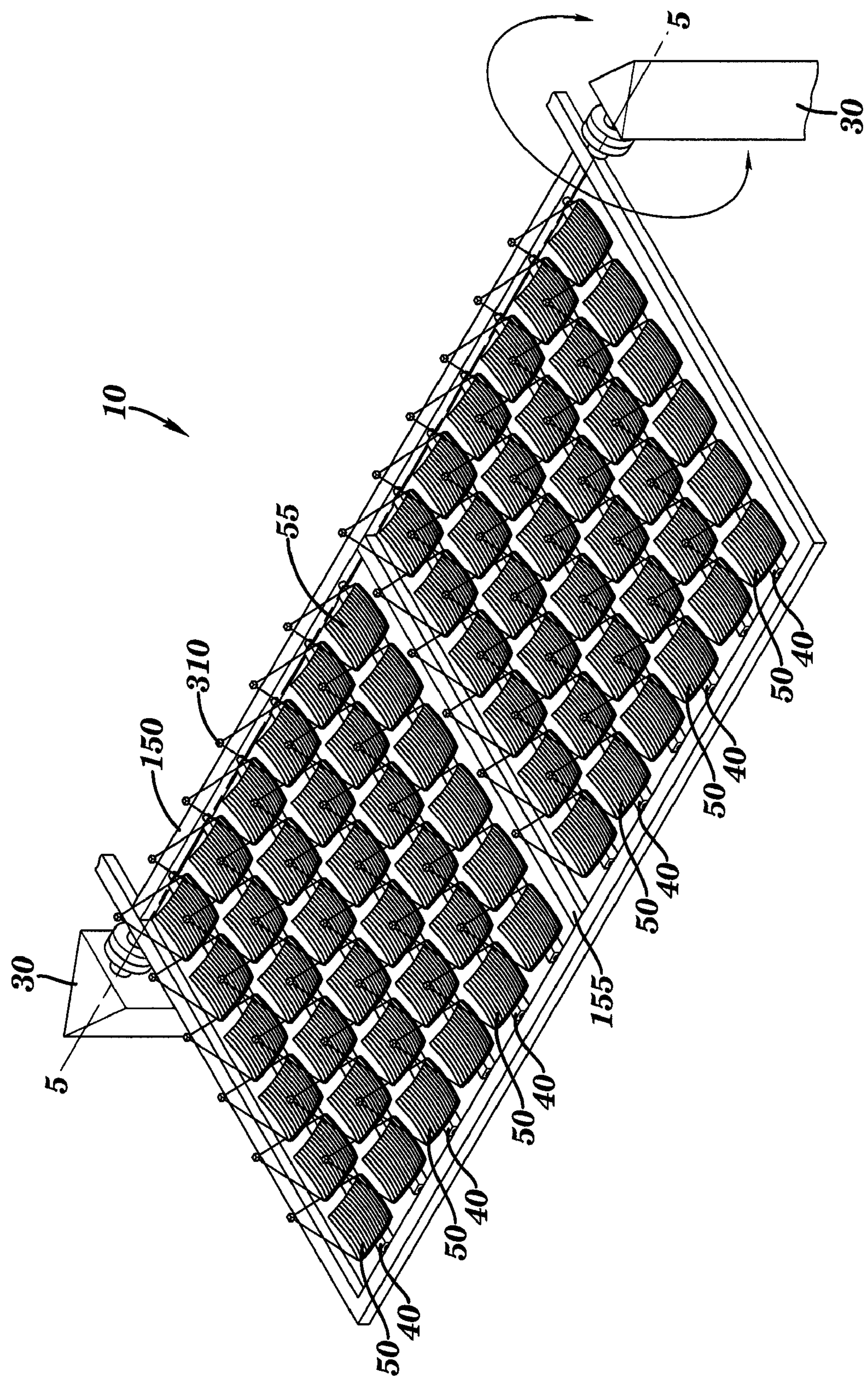
FIG. 3 is a perspective view of a portion of FIG. 2.
Figure 5:
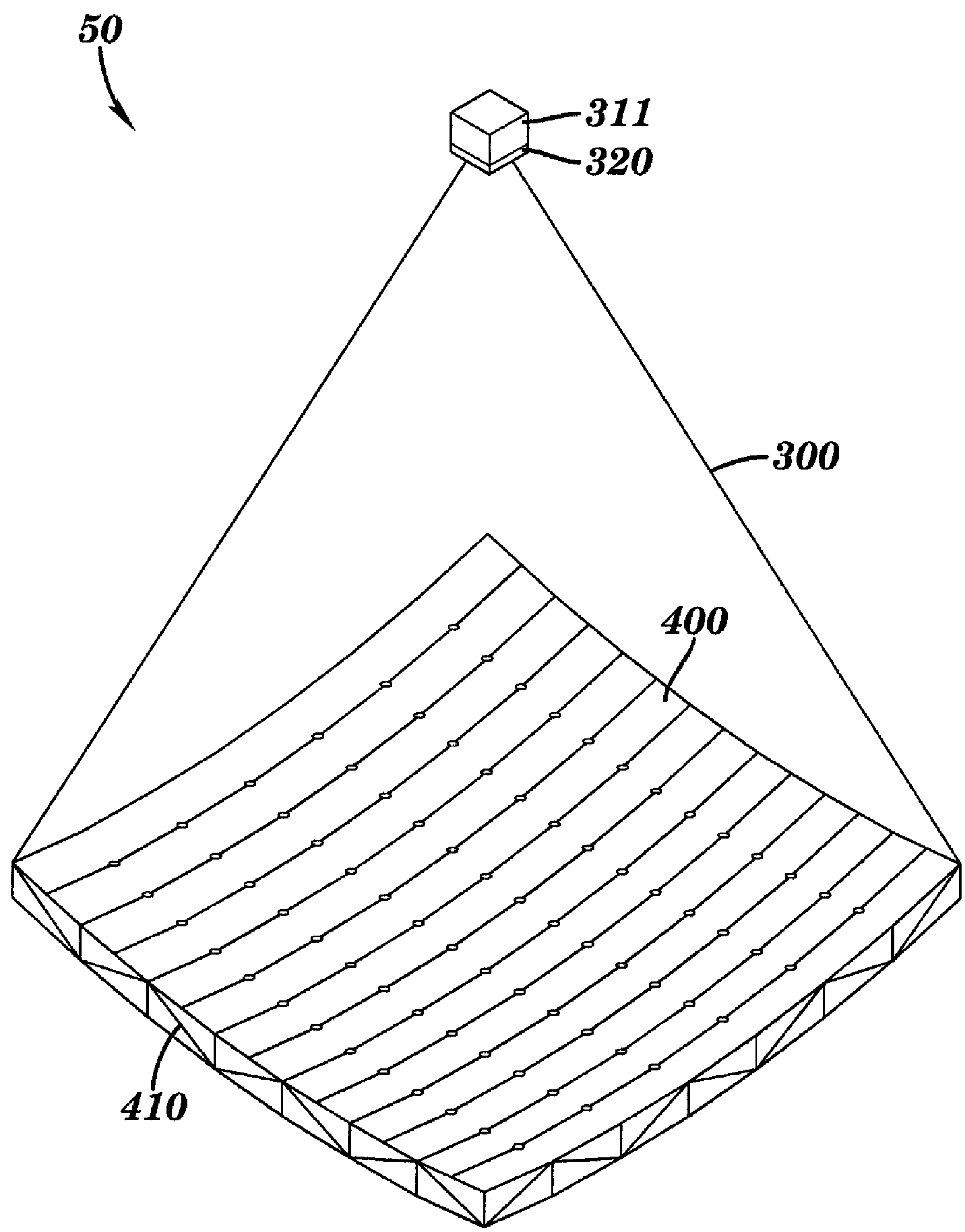
FIG. 5 is a perspective view of a module of Fresnel reflectors for use with the system of FIG. 1.

Each optical truss of optical trusses 40 includes multiple modules 50 (represented by 'X's in FIGS. 2-3 and depicted in FIG. 5) configured to direct solar radiation. As depicted in FIG. 5, a first module 55 of modules 50 includes a Fresnel array of 1-axis concentrator mirrors arranged for 2-axis concentration. The array includes multiple strips 400 of reflective material bent in substantially 1 dimension allowing a linear concentration of solar energy. The strips may be mounted on a strip supporting structure 410 mounted to one of optical trusses 40. Each strip of strips 400 is substantially parabolic and creates a linear focus. The strips are arranged so that the linear foci substantially superpose creating a substantially uniform two-axis area of concentrated solar energy. Strips 400 are Fresnel reflectors, which decrease the mass of material required for a lens of a certain size relative to a conventional reflector. The strips are arranged in a substantially parallel array with all of strips 400 of module 55 concentrating a substantially constant irradiance on a first dense array 311 of dense arrays 310 (FIG. 3) of concentrator PV chips located above module 55. First dense array 311 is supported on a substrate 321 which is supported by a supporting structure 301 above first module 55. Each of strips 400 may be substantially 6 to 60 inches wide and a whole array or module may be substantially 3 to 30 foot on a side. For example, one of strips 400 mounted on module 55 may be 8 inches wide by 4 foot long and module 55 may be four foot wide by four foot long. Multiple strips 400 may thus be utilized on module 55 as depicted in FIG. 5. The use of strips 400 (i.e., a Fresnel array of 1-axis concentrator mirrors arranged for 2-axis concentration) is an improvement on the prior art in both scale and technique. Strips 400 allow more solar power to be collected per device relative to standard practice (e.g., as compared to a non-concentrating or non-Fresnel system) and the concentrated energy provided by the strips is substantially constant in irradiance providing higher efficiency of energy conversion from solar radiation to electricity.

As described above, a paraboloid is a specific shape which can reflect parallel rays of light to a point. A Fresnel concentrator (e.g., strips 400) works the same way as a continuous paraboloid. Except for symmetry, each of the reflector elements (e.g., each strip of strips 400) of a Fresnel concentrator is part of a different paraboloid, with a different focal length, f, which is arranged in space so that the focus of each element is at the same point in the focal plane.

Multiple dense arrays 310 of concentrator PV chips are supported on multiple substrates 320 above modules 50 as depicted in FIG. 4. Each of dense arrays 310 generates electricity in response to receiving radiation from the sun directed from each of modules 50. The concentrated solar energy of substantially constant irradiance allows the use of various concentrator PV chip technologies (e.g., monolithically integrated modules of AlGaAs/GaAs concentrator cells), vertical multi-junction silicon concentrator PV cells or cells such as spectrolab triple junction cell. Each of dense arrays 310 may be substantially 1 to 10 inches by 6 to 60 inches on a side. Support structures 300 support dense arrays 310 with respect to (e.g., above) modules 50, each of which includes a Fresnel array of reflectors (e.g., strips 400).

The use of dense arrays 310 of concentrator PV chips to receive the reflected solar radiation is an improvement on the current practice of concentrating on a single concentrator PV chip. A single chip produces both a smaller amount of power and a lower voltage higher current output relative to a dense array. The dense array also allows for smaller diameter wires to collect more power more efficiently. Additionally the dense array provides a single heat removal device for a large amount of electricity rather than many more heat removal devices in current practice. Dense array 310 supported on a substrate 320 may be cooled by either active or passive heat removal. Further, system 10 may include dense array 310 as described or multiple such dense arrays may be mounted on support structure 300 or otherwise and may receive the reflected solar radiation from modules 50.

As described above, conventional concentrator PV systems scale in size differently than conventional flat-plate (i.e., non-concentrating) photovoltaic systems, which are made for substantially 1-sun operation. Conventional PV is scaled by adding more panels and thus more surface area to generate electricity. A problem with conventional PV is that large areas of expensive semi-conductor PV cells are required. Concentrator PV uses optical devices to increase the solar energy landing on the expensive PV cells, reducing the cost of the PV system (i.e., by using less PV cells). Concentrator systems are enhanced by tracking the sun to allow for optical concentration of energy of substantially 100 to 1000 times that of 1-sun. However, simple scaling of convex lens optical systems for concentrator systems is limited by the mass of material needed. Fresnel lenses, as included in system 10, decrease the mass of material required for a lens of a certain size. Fresnel lens concentrator systems may include lenses of up to about a couple square meters as opposed to about 100 square meters for conventional concentrator systems which are limited by wind loads on the corresponding supporting structure. Fresnel lens concentrator systems may also include multiple lens arrays of up to several hundred square meters.

Controller 201 may include various kinds of memory, power supply, and various analog and digital inputs and outputs. Controller 201 could also be one computing unit or multiple coupled computing units. Controller 201 may be connected to sensors and actuators to provide safe optimal control of system 10. For example, controller 201 may be coupled to a wind sensor, snow sensor, rain sensor, or other meteorological sensors to determine environmental conditions around system 10. The information provided to controller 201 by any such sensor(s) may allow controller 201 to automatically rotate the optical trusses relative to the frame and/or the frame relative to the towers to minimize any potential damage to system 10 resulting from the environmental conditions. For example, the optical trusses and/or the frame may be rotated (e.g., by a motor controlled by controller 201) during, or prior to, a snowstorm to inhibit the collection of snow on the trusses or the dense array of concentrator PV chips. After such a snow storm is over, the trusses may be rotated such that the Fresnel array(s) of 1-axis concentrator mirrors arranged for 2-axis concentration of the module(s) may rotated to dump the snow and begin operation as a solar concentrator.

Further, wind forces are often the controlling forces on solar concentrator systems. In one example, controller 201 could control a motor to rotate the frame relative to a horizontal position to minimize wind forces on the frame. Also, the optical trusses could be rotated to minimize wind forces on the optical trusses and the Fresnel array of 1-axis concentrator mirrors arranged for 2-axis concentration of the modules supported on the optical trusses. In a further example, dust falling in substantially still air and dirt blowing in moving air could be local weather problems. Frame 20 and/or optical trusses 40 may be rotated such that dust lands only on edge surfaces of the modules and does not build up on the operating surfaces thereof. Likewise the optical trusses may be rotated to minimize the area of the Fresnel array of 1-axis concentrator mirrors arranged for 2-axis concentration exposed to blowing dirt.

In sunny conditions, controller 201 may monitor the temperatures of the dense arrays via a temperature sensor(s) to insure efficient operation and to ensure the heat removal is appropriate for heat rejection or use. For example, heat transfer fluids may flow through a system of conduits (not shown) to provide such a heat transfer (e.g., cooling of the dense arrays of PV cells) and such flow of the heat transfer fluids may be controlled by controller 201 which may regulate flow of the fluid via one or more pumps.

Controller 201 may also monitor the positions of various components of system 10 (e.g., frame 20 and optical trusses 40 and modules 50) via sensors on the components or may calculate such positions based on movement of the motor(s) moving such components.

Controller 201 may further include geographic positioning system (GPS) technology which may allow controller 201 to automatically adjust how much to rotate the optical trusses relative to frame 20 for optimal declination tracking. For example, the GPS technology may allow controller 201 to adjust the rotation based on a distance of system 10 from the equator.

The 2-axis split-axis Fresnel tracking system (i.e., use of frame 20 rotatable relative to towers 30 about a polar axis and optical trusses rotatable relative to frame 20 about a declination axis) is an improvement on current practice as the double support allows a substantial quadrupling of the size of the active area of the concentrator, because the tracking by the rotation allows more of the reflector to face the sun over the course of a day and year. Additionally the polar-declination (i.e., rotation of frame 20 about polar axis 5 and of optical trusses 40 relative to frame 20) tracking geometry is the most efficient mechanically. Relative to both axes, the rotations of a base frame (i.e., frame 20), and the multiple optical trusses (i.e., optical trusses 40), are substantially around the center of mass of the axis. This allows for lower power actuators (e.g., motors, pistons, etc.) while retaining the high force required by the actuators or motors. Furthermore, the polar-declination tracking technique matches motion of the sun with the simplest, slowest movements of the two axes providing tracking accuracy that can match any solar concentration application.

In one example, system 10 may include 324 modules 50, each of which has an array of strips 400 (e.g, Fresnel optic mirrors) mounted on optic trusses 40 with each array of strips 400 (i.e., of each module) being about 1 $m^2$ in area. Frame 20 may be 19.5 m (north/south faces) by 19.8 m (east/west face). The frame is bisected along the N-S axis with a backbone truss (i.e, North-south connecting truss 150) into two smaller frames connected to each other. A receiver/focal point (e.g., dense array 310) is located about 19.75 m above the center of the optic mirrors (e.g., modules 50 including strips 400) on a supporting structure (e.g., supporting structure 300). A shorter south end tower (e.g., tower 32) may resist both axial loads from the tower frame as well as torque loading from a frame (e.g., frame 20). A taller north end tower (e.g., tower 31) may resist only the axial loads from wind and weight of the frame. Also, a tilt angle of the support frame (e.g., frame 20) relative to the horizontal position along the N-S axis is dictated by a site latitude (e.g., for Peoria, Ill., the latitude is 40.74°). The solar concentrator (e.g., system 10) may rotate about the N-S axis (along the axis of the backbone truss). Further, in a morning position the support frame (e.g., frame 20) is approximately vertical, and in a noon (or stow) position the support frame is about parallel to the horizontal position.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

The invention claimed is:

1. A solar energy concentrator system comprising:

a supporting structure;

a plurality of solar modules coupled to said supporting structure, each module of said plurality of solar modules comprising a plurality of Fresnel reflectors and a photovoltaic cell;

said plurality of reflectors of each module arranged to focus solar radiation linearly onto said photovoltaic cell of each module;

said supporting structure rotatably connected to a plurality of support members and aligned to allow said supporting structure to rotate about a polar axis; and a plurality of optical trusses connected to said plurality of solar modules and rotatably connected to said supporting structure to allow said plurality of solar modules to be rotated about a declination axis to track a motion of the sun through seasons of the year.

2. The system of claim 1 further comprising a driver, said driver coupled to said supporting structure and comprising a plurality of actuators connected to said supporting structure and configured to rotate said supporting structure about said polar axis and said optical trusses about said declination axis.

3. The system of claim 2 further comprising a controller coupled to said driver, said controller configured to control said driver to regulate a rotation of said supporting structure about said polar axis and said plurality of optical trusses about said declination axis.

4. The system of claim 1 wherein said plurality of support members consist of two towers supporting said supporting structure above a surface of the ground.

5. The system of claim 1 wherein said plurality of optical trusses are aligned substantially perpendicular to the polar axis.

6. The system of claim 1 wherein each module of said plurality of modules comprises an area of about 16 square feet.

7. The system of claim 1 wherein each module of said plurality of modules comprises a plurality of Fresnel reflectors wherein each reflector of said plurality of reflectors comprises a width of about 8 inches.

8. The system of claim 7 wherein said plurality of Fresnel reflectors comprises a plurality of one axis concentrator mirrors arranged for two axis concentration.

9. The system of claim 1 wherein said photovoltaic cell comprises a first photovoltaic cell of a dense array of concentrator photovoltaic cells.

10. The system of claim 1 wherein said supporting structure comprises a frame located peripheral to said plurality of modules.

11. The system of claim 1 wherein said supporting structure comprises 4 quadrants and each quadrant comprises about 7 optical trusses of said plurality of optical trusses.

12. The system of claim 1 wherein said plurality of support members comprise a first support member and second support member wherein said first support member has a greater height than a second support member and said first support member is located farthest from the equator relative to the second support member and first support member and second support member are aligned on the polar axis relative to each other.

13. A method for concentrating solar energy to generate electricity comprising:

providing a plurality of solar modules coupled to a supporting structure, each module of the plurality of the modules comprising a plurality of Fresnel reflectors and a photovoltaic cell;

arranging the plurality of reflectors to focus solar radiation linearly onto the photovoltaic cell;

rotatably connecting the supporting structure to a plurality of support members and aligning the supporting structure to allow the supporting structure to rotate about a polar axis; and connecting a plurality of optical trusses to the plurality of solar modules and rotatably connecting the plurality of optical trusses to the supporting structure to allow the plurality of solar modules to be rotated about a declination axis to track a motion of the sun through seasons of the year.

14. The method of claim 13 further comprising coupling a driver to the supporting structure, the driver comprising a plurality of actuators connected to the supporting structure and configured to rotate the supporting structure about the polar axis and the optical trusses about the declination axis.

15. The method of claim 14 further comprising controlling the driver by a controller coupled to the driver to regulate a rotation of the supporting structure about the polar axis and the plurality of optical trusses about the declination axis.

16. The method of claim 13 wherein each module of the plurality of modules comprises a plurality of Fresnel reflectors.

17. The method of claim 16 wherein the plurality of Fresnel reflectors comprises a plurality of one axis concentrator mirrors arranged for two axis concentration.

18. The system of claim 1 wherein the plurality of solar modules comprises a first module of the plurality of modules having a plurality of first Fresnel reflectors and a first photovoltaic cell, and the plurality of solar modules comprises a second module of the plurality of solar modules having a plurality of second Fresnel reflectors and a second photovoltaic cell, the first module connected to a first optical truss of the plurality of optical trusses and the second module connected to a second optical truss of the plurality of optical trusses such that the first cell and the second cell avoid being linearly aligned relative to each other.

19. The system of claim 1 wherein each Fresnel reflector of the plurality of Fresnel reflectors comprises a plurality of strips. Each strip of the plurality of strips being shaped substantially parabolically and creating a linear focus, the strips arranged such that linear foci created by the plurality of strips substantially superpose creating a substantially uniform two-axis area of concentrated solar energy.

* * * * *